United States Patent
Shinagawa et al.

(10) Patent No.: US 7,451,266 B2
(45) Date of Patent: Nov. 11, 2008

(54) NONVOLATILE MEMORY WEAR LEVELING BY DATA REPLACEMENT PROCESSING

(75) Inventors: Chiaki Shinagawa, Kodaira (JP); Atsushi Shiraishi, Kodaira (JP); Motoki Kanamori, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/723,334

(22) Filed: Mar. 19, 2007

(65) Prior Publication Data

US 2007/0186033 A1    Aug. 9, 2007

Related U.S. Application Data

(63) Continuation of application No. 10/809,416, filed on Mar. 26, 2004, now abandoned.

(30) Foreign Application Priority Data

Apr. 10, 2003    (JP)    ............................. 2003-106360

(51) Int. Cl.
    *G06F 12/02*    (2006.01)
(52) U.S. Cl. .................................. 711/103; 365/185.33
(58) Field of Classification Search .................. 711/103; 365/185.33
    See application file for complete search history.

(56) References Cited

U.S. PATENT DOCUMENTS

| | | | |
|---|---|---|---|
| 5,043,940 A | | 8/1991 | Harari |
| 5,172,338 A | | 12/1992 | Mehrotra et al. |
| 6,000,006 A | * | 12/1999 | Bruce et al. .................. 711/103 |
| 6,145,051 A | * | 11/2000 | Estakhri et al. ............. 711/103 |
| 7,240,178 B2 | | 7/2007 | Nakada et al. |
| 2004/0080985 A1 | * | 4/2004 | Chang et al. ........... 365/185.33 |

FOREIGN PATENT DOCUMENTS

| | | |
|---|---|---|
| JP | 2001-184268 | 7/2001 |
| JP | 2001-306384 A | 11/2001 |
| JP | 2003-050747 A | 2/2003 |

\* cited by examiner

*Primary Examiner*—Kevin Ellis
*Assistant Examiner*—Jared I Rutz
(74) *Attorney, Agent, or Firm*—Miles & Stockbridge P.C.

(57) ABSTRACT

A risk of data garbling due to cumulative impact of disturbances occurring in memory areas in which no rewrite occurs is to be prevented. A memory device has an erasable and writable nonvolatile memory and a control circuit, wherein the control circuit is enabled to perform processing at a prescribed timing to replace memory areas. The replacement processing is accomplished by writing stored data in a first memory area in which rewriting is relatively infrequent into an unused second memory area, and making the second memory area into which the writing has been done a used area in place of the first memory area. Since this replacement processing is intended to replace memory areas in which rewriting is infrequent with other memory areas as described above, it is possible to prevent the risk of data garbling due to the cumulative impact of disturbances occurring in memory areas in which no rewrite occurs.

7 Claims, 16 Drawing Sheets

FIG. 10
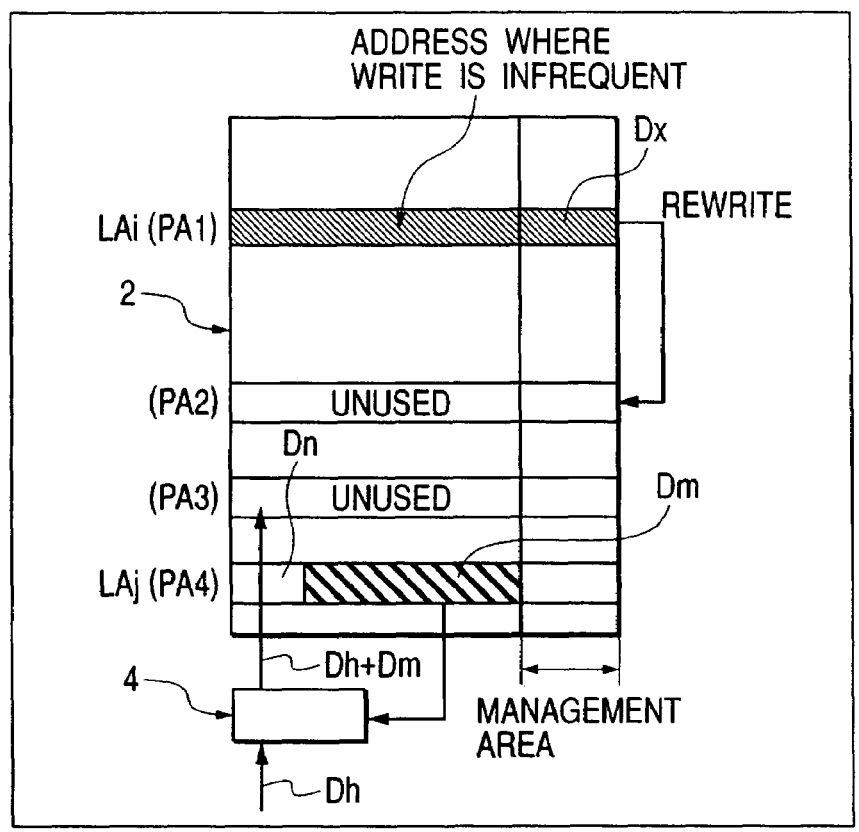
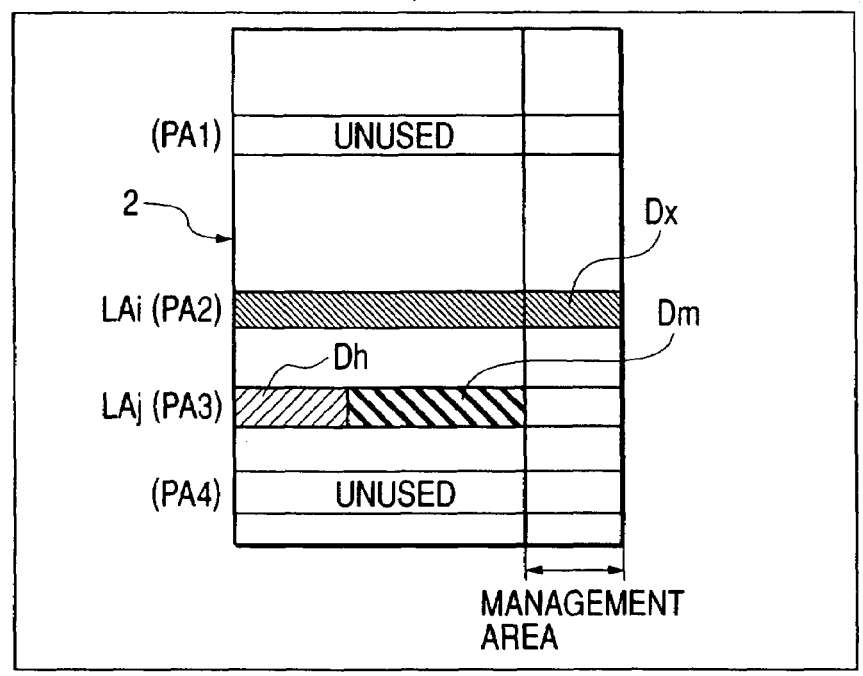

NONVOLATILE MEMORY WEAR LEVELING BY DATA REPLACEMENT PROCESSING

CROSS-REFERENCE TO RELATED APPLICATION

This application is a continuation of application Ser. No. 10/809,416 filed Mar. 26, 2004 now abandoned.

BACKGROUND OF THE INVENTION

The present invention relates to a nonvolatile memory device and to a technique that can be effectively applied to, for instance, flash memory cards, hard disk-compatible flash disks, and the like.

Rewriting of stored information in an electrically rewritable nonvolatile memory, typically a flash memory, involves electrical stresses in memory cells, whose performance characteristics would deteriorate with an increase in the frequency of rewriting. If rewrites locally concentrate, only some data blocks markedly deteriorate in characteristics. There is a technique to solve this problem by which data and addresses are automatically relocated into other areas when the frequency of rewriting has reached a certain level, and the useful life of the nonvolatile memory is extended in terms of the permissible frequency of rewriting. For instance, when the frequency of rewriting surpasses a prescribed level, the address allocation in data blocks is altered (see Patent Reference 1). There is also a technique by which the address allocation in data blocks is altered when the number of ECC errors surpasses a prescribed level (see Patent Reference 2).

[Patent Reference 1]
Japanese Unexamined Patent Publication No. Hei 04 (1992)-507320 (U.S. Pat. No. 5,172,338)

[Patent Reference 2]
Japanese Unexamined Patent Publication No. Hei 02 (1990)-118997 (U.S. Pat. No. 5,043,940)

SUMMARY OF THE INVENTION

However, by either of the conventional techniques described above, the frequency of rewriting in memory areas which are seldom rewritten does not increase, and accordingly any such memory area is rarely replaced by another. In memory areas where replacement does not take place, affected by cumulative disturbances on word lines and bit lines, eventually variations in threshold voltage may become too great to ignore, and stored information may be inverted undesirably (garbled).

The present inventors have proposed in a prior application (U.S. application Ser. No. 10/667,663), not publicly known yet, a memory card in which the stored information will not be undesirably lost even if the operating power supply is cut off during erasure and write processing. Thus, an erasure table, in which vacancy information flags matched are with memory areas therein, is prepared for the management of storage in the memory card and, when writing into the memory card, the vacancy information flags in the erasure table are referenced to determine the memory area into which rewrite data are to be written, and writing the data into a different memory area from the pre-rewrite memory area, thereby enabling the data before the rewrite to remain in the original memory area even after the rewrite. Even if power supply is undesirably cut off during erasure and the like, the data can be restored by using the remaining data in the original memory area.

In such a table system of writing, the previous data can be maintained by writing data into a new sector, not erasing the previous data and only updating the erasure table. However, since the vacant area newly used by writing is an unused memory area, no memory area in which no rewrite occurs is replaced by an unused memory area. In this case, too, as in the foregoing instance, in memory areas where replacement does not take place, affected by cumulative disturbances on word lines and bit lines, data may be garbled.

An object of the present invention is to provide a memory device whose risk of data garbling under the cumulative impact of disturbances in memory areas in which no rewrite occurs can be eliminated in advance.

The above-stated and other objects and novel features of the invention will become more apparent from the following description in the specification when taken in conjunction with the accompanying drawings.

Typical aspects of the invention disclosed in the present application will be briefly described below.

[1] A memory device pertaining to the invention comprises an erasable and writable nonvolatile memory and a control circuit, wherein the control circuit is enabled to perform replacement processing of memory areas at a prescribed timing. The replacement processing is accomplished by writing stored data in a first memory area in which rewriting is relatively infrequent into an unused second memory area, and making the second memory area into which the writing has been done a used area in place of the first memory area. Since this replacement processing is intended to replace memory areas in which rewriting is infrequent with other memory areas as described above, it is possible to prevent the risk of data garbling due to the cumulative impact of disturbances occurring in memory areas in which no rewrite occurs.

Regarding the selection of the replacement source, where the memory area holds rewrite frequency data, the control circuit can reference rewrite frequency data obtained from each of a group of memory areas and search them for the first memory area.

Regarding the selection of the replacement destination, where the nonvolatile memory is provided in each erase unit, for instance, of its memory areas with a storage area for a distinguishing flag indicating whether or not the area is unused, the control circuit can reference the distinguishing flag to search for the unused second memory area.

In another form of selecting the replacement destination, where the memory area holds rewrite frequency data, the control circuit can reference the rewrite frequency data to search for a memory area in which rewriting is more frequent than in the first memory area and to make it the second memory area.

Regarding the trigger of a shift to the replacement processing, the following forms are available. First, the replacement processing is performed in response to a specific command. Second, the replacement processing is performed in response to the completion of the processing of a specific command. In the event of instruction by another command after the start of the replacement processing, the ongoing replacement processing is abandoned to give priority to the processing of that other command. This is intended to prevent prioritized processing, such as read, from being delayed.

[2] A memory device according to another aspect of the present invention comprises an erasable and writable nonvolatile memory and a control circuit wherein the control circuit is enabled to perform replacement processing of memory areas at a prescribed timing, and the replacement processing is accomplished by replacing with a prescribed unused memory area a prescribed used memory area in which rewriting is less frequent than in the prescribed unused memory area. Since this replacement processing is intended to replace a used memory area in which rewriting is less frequent with an unused memory area, it is possible to prevent the risk of data garbling due to the cumulative impact of disturbances occurring in memory areas in which no rewrite occurs.

Replacement processing in a memory device in another aspect of the invention is accomplished by replacing a prescribed memory area with another in which rewriting is less frequent than that prescribed memory area and converting the other memory area from a used state to an unused state while the prescribed memory area after the replacement is being used. Since this replacement processing is also intended to replace a memory area in which rewriting is less frequent with another memory area, it is possible to prevent the risk of data garbling due to the cumulative impact of disturbances occurring in memory areas in which no rewrite occurs.

[3] A memory device according to another aspect of the present invention comprises an erasable and writable nonvolatile memory and a control circuit. The nonvolatile memory has an unused area distinguishing table for storing a distinguishing flag which indicates whether or not any memory area is an unused area. The control circuit, in write processing, makes one of the unused memory areas indicated by the distinguishing flag the destination for data writing and is enabled to perform replacement processing at a prescribed timing on the used memory area indicated by the distinguishing flag. The replacement processing is accomplished by writing stored data in a first memory area in which rewriting is relatively infrequent into an unused second memory area, and making the second memory area into which the writing has been done a used area in place of the first memory area.

Since any write in the write processing described above would substantially result in the replacement of a memory area by making one of the unused memory areas indicated by the distinguishing flag the destination for data writing, this contributes to evening out the frequencies of writing into memory areas to that extent. Furthermore, in rewriting data and the like, since a memory area different from the write source is made a new write area, even if an undesired power cutoff and the like occurs during write processing, the original data will remain in the write source memory area immediately after the cutoff, and accordingly the lost data can be restored.

As this replacement processing is intended to replace a memory area in which rewriting is less frequent with another memory area, it is possible to prevent the risk of data garbling due to the cumulative impact of disturbances occurring in memory areas in which no rewrite occurs.

In a specific form of implementing the invention, the nonvolatile memory has a used address registration table for registering, matched with logical addresses, the physical addresses of memory areas to be used. Then, the control circuit, when altering the distinguishing flag to an unused area, invalidates the matching between the memory area allocated to the distinguishing flag and the physical address and, when altering the distinguishing flag to a used area, matches the memory area allocated to the distinguishing flag with a prescribed physical address.

In another specific form of implementing the invention, the control circuit, when it is to replace one memory area with another memory area to alter it into a used area, performs processing, before causing the matching between the logical address and the physical address pertaining to that alteration to be reflected in the used address registration table on the nonvolatile memory, to cause the distinguishing flag for the one memory area to be altered from an unused area to a used area to be reflected in the unused area distinguishing table on the nonvolatile memory and performs processing, after the matching has been reflected in the used address registration table, to cause the distinguishing flag for the other memory area to be altered from a used area into an unused area to be reflected in the unused area distinguishing table on the nonvolatile memory. This makes it possible to ensure that the original memory area can be searched for data restoration.

BRIEF DESCRIPTION OF THE DRAWINGS

FIG. 10 schematically illustrates how data is shifted by the replacement processing described with reference to FIG. 5 and the flow of data resulting from the write processing described with reference to FIG. 8;

DETAILED DESCRIPTION OF THE PREFERRED EMBODIMENTS

<Memory Card>

Figure 1:
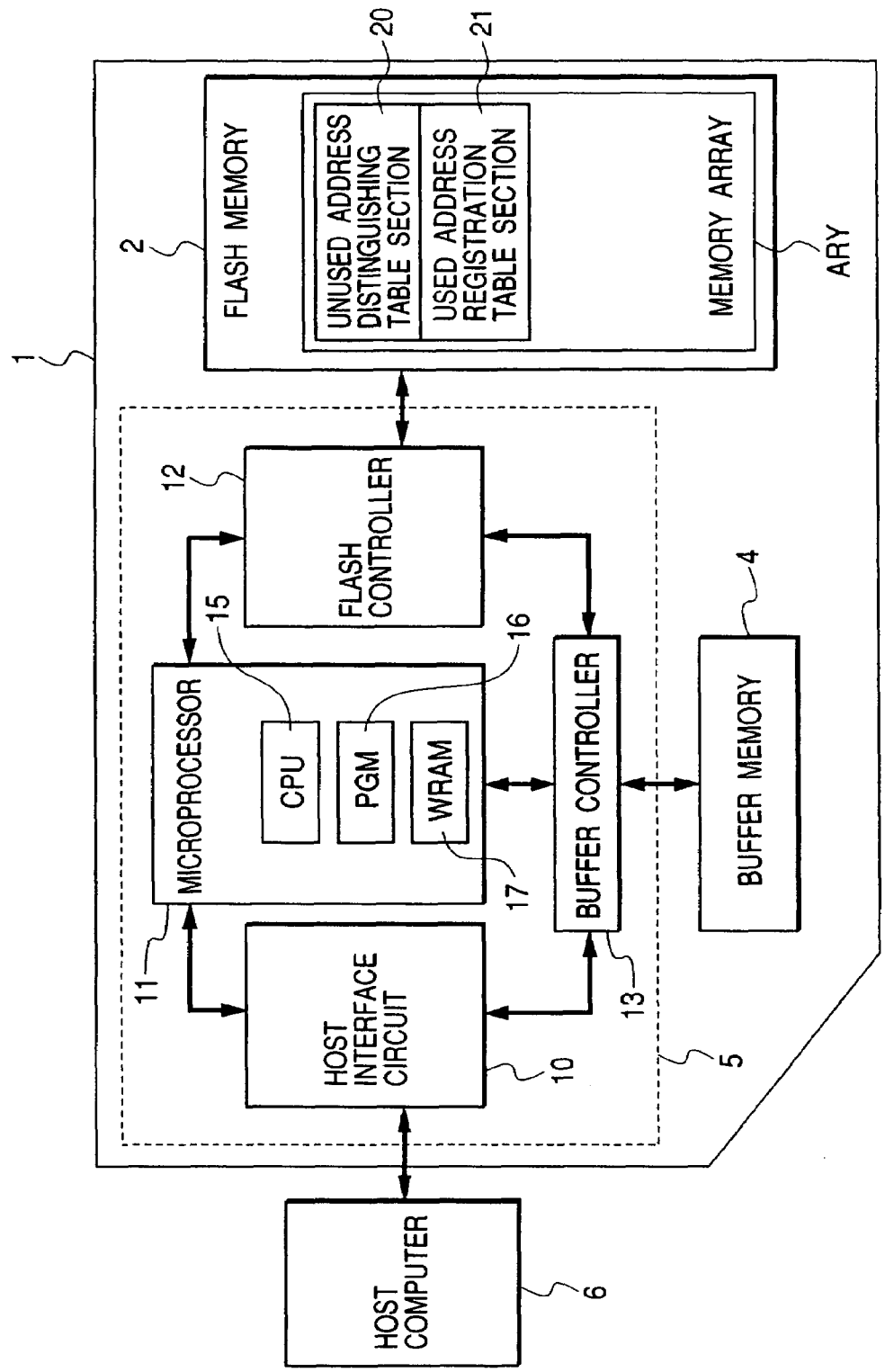
FIG. 1 is a block diagram of a flash memory card pertaining to one aspect of the present invention.

FIG. 1 shows a flash memory card, which is an example of memory device pertaining to the present invention. The flash memory card 1 is configured of an erasable and writable nonvolatile memory, e.g. a flash memory 2, a buffer memory 4 consisting of a dynamic random access memory (DRAM) or a static random access memory (SRAM), and a card controller (control circuit) 5 to perform memory control and external interface control, all being mounted on a package substrate.

The buffer memory 4 and the flash memory 2 are under access control by the card controller 5. The flash memory 2, though not specifically illustrated, has a memory array ARY in which a large number of electrically erasable and writable nonvolatile memory cell transistors are arranged in a matrix. Each of the memory cell transistors (sometimes alternatively referred to as flash memory cells), though not specifically illustrated, is configured of a source and a drain formed over a semiconductor substrate or in a well, a floating gate formed in a channel area between the source and the drain with a tunnel oxide film in-between, and a control gate laid over the floating gate with an inter-layer insulating film in-between. The control gate is connected to the matching word line, the drain to the matching bit line, and the source to the source line. The threshold voltage of the memory cell transistor rises when electrons are injected into the floating gate and drops when electrons are extracted from the floating gate. The memory cell transistor stores information according to the level of the threshold voltage relative to a word line voltage for reading out data (the voltage applied to the control gate). Though not particularly limited to these expressions, in the context of this specification, a state in which the threshold voltage of the memory cell transistors is low will be referred to as an erasure state and a state in which it is high will be referred to as a write state.

Referring to FIG. 1, the card controller 5 performs, in relation to a host computer (host device) 6 for instance, external interface control conforming to the IDE disk interface specifications and the like. The card controller 5 has an access control function to access the flash memory 2 at an instruction from the host computer 6. This access control function is a hard disk-compatible control function. For instance, when the host computer 6 manages a set of sector data as file data, the card controller 5 performs access control over the flash memory 2 by matching sector addresses as logical address with physical memory addresses. As shown in FIG. 1, the card controller 5 consists of a host interface circuit 10, a microprocessor (MPU) 11 as computation control means, a flash controller 12, and a buffer controller 13. The flash controller 12 is provided with an ECC (not shown).

The MPU 11 has a central processing unit (CPU) 15, a program memory (PGM) 16 and a work RAM (WRAM) 17 among other elements, and exercises overall control on the card controller 5. The program memory 16 stores operation programs and the like for the CPU 15.

The host interface circuit 10 is a circuit for interfacing with the host computer 6, such as a personal computer or a work station in accordance with prescribed protocols including AT Attachment (ATA), Integrated Device Electronics (IDE), Small Computer System Interface (SCSI), MultiMediaCard (MMC: registered trademark), and Personal Computer Memory Card International Association (PCMCIA). The host interfacing operation is controlled by the MPU 11.

The buffer controller 13 controls the memory access operation of the buffer memory 4 in accordance with access instructions from the MPU 11. The buffer memory 4 temporarily holds data entered into the host interface 10 or data to be supplied from the host interface 10. The buffer memory 4 also temporarily holds data read out of the flash memory 2 or data to be written into the flash memory 2.

The flash controller 12 controls actions to read data out of, erase data in and write data into the flash memory 2 in accordance with access instructions from the MPU 11. The flash controller 12 supplies, when in read action, read control information including read command codes and read address information; when in write action, write control information including write command codes and write address information and, when in erase action, erase control information including erase commands. The ECC circuit (not shown) generates error correction codes in accordance with instructions from the MPU 11, and adds them to the data to be written into the flash memory 2. It also subjects data read out of the flash memory 2 to error detection and correction by using error correction codes added to the read data, and thereby performs correction of errors occurring within its error correcting capability.

The flash memory 2 has an unused area distinguishing table section 20 and a used address registration table section 21 within part of its memory array ARY.

Figure 2:
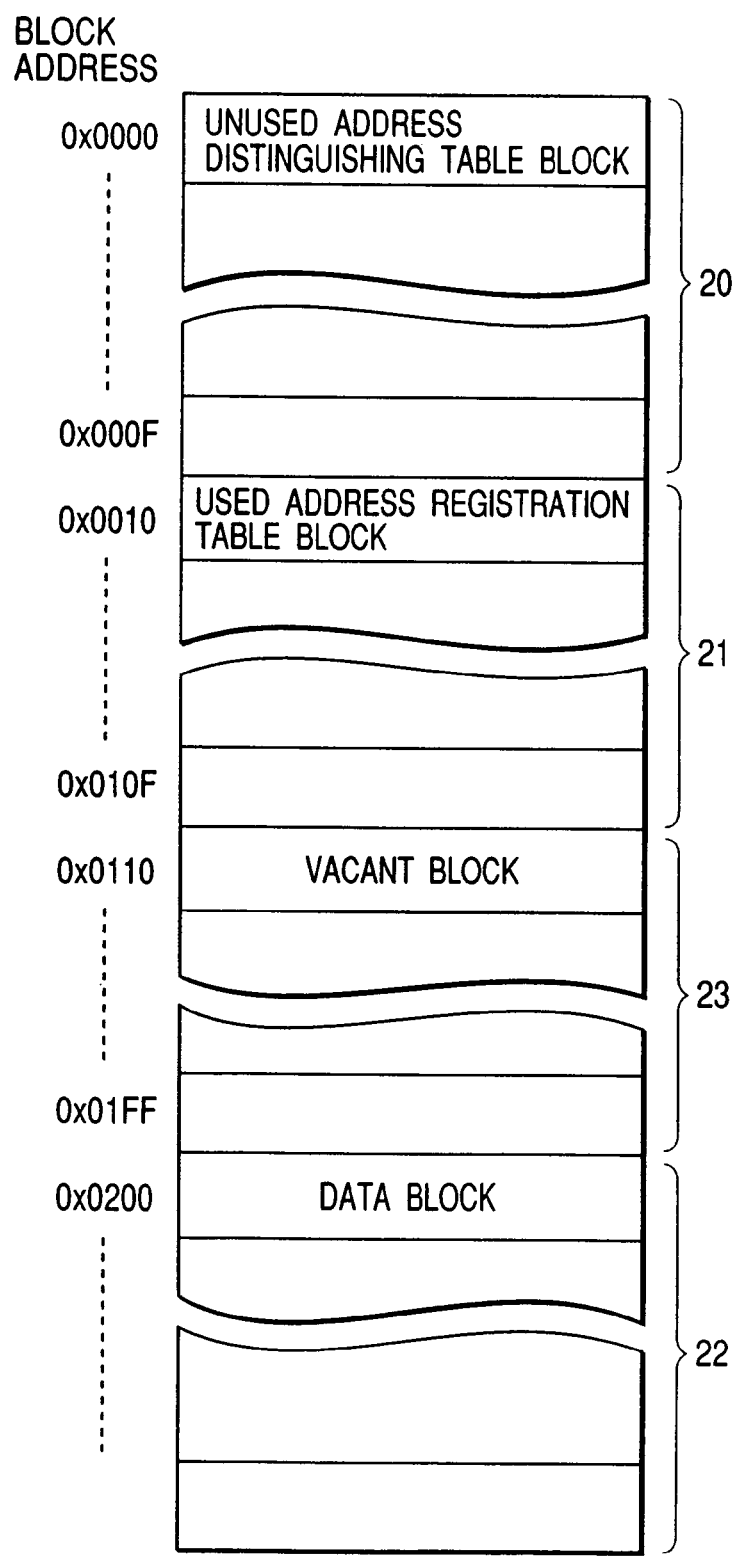
FIG. 2 illustrates an example of storage area in the flash memory.

FIG. 2 illustrates an example of storage area in the flash memory 2. The storage area (memory array ARY) of the flash memory 2 can be broadly classified into the unused area distinguishing table section 20, the used address registration table section 21, a user area 22, and a vacant block area 23 needed for updating the unused area distinguishing table section and the used address registration table section. To each memory block (memory sector) in each area is assigned a block address as a physical address. These memory blocks may sometimes be referred to simply as blocks. Each block has a capacity of, though not limited to, about 2 kilobytes (KB), and each of the memory cell arrays contained in each block is selected according to one word line or one type of word line selection signal, and constitutes the unit of erase processing and write processing. Thus in this configuration, a high voltage needed for erase processing and write processing is applied word line by word line. One block here has a greater capacity than the 512 byte (B) capacity of a sector (storage sector), which is the rewrite unit in a storage, such as an HDD. For instance, one such block has a storage capacity of that combining four storage sectors, the ECC code and the management area.

Each of the unused area distinguishing table section 20 and the used address registration table section 21 is assigned a plurality of single blocks, though the manner of division is not limited to this, and each of the unused area distinguishing table and the used address registration table is stored by being multiplexed within the block. For instance, the unused area distinguishing table section 20 is arranged at block addresses 0x0000 through 0x000F, and each block is divided accordingly, each block being given an address of 0x0000 and the like. The used address registration table section 21 is assigned a plurality of single blocks, arranged at block addresses 0x0010 through 0x010F, and each block is divided accordingly, each block being given an address of 0x0010 and the like.

<Used Address Registration Table>

Figure 3:
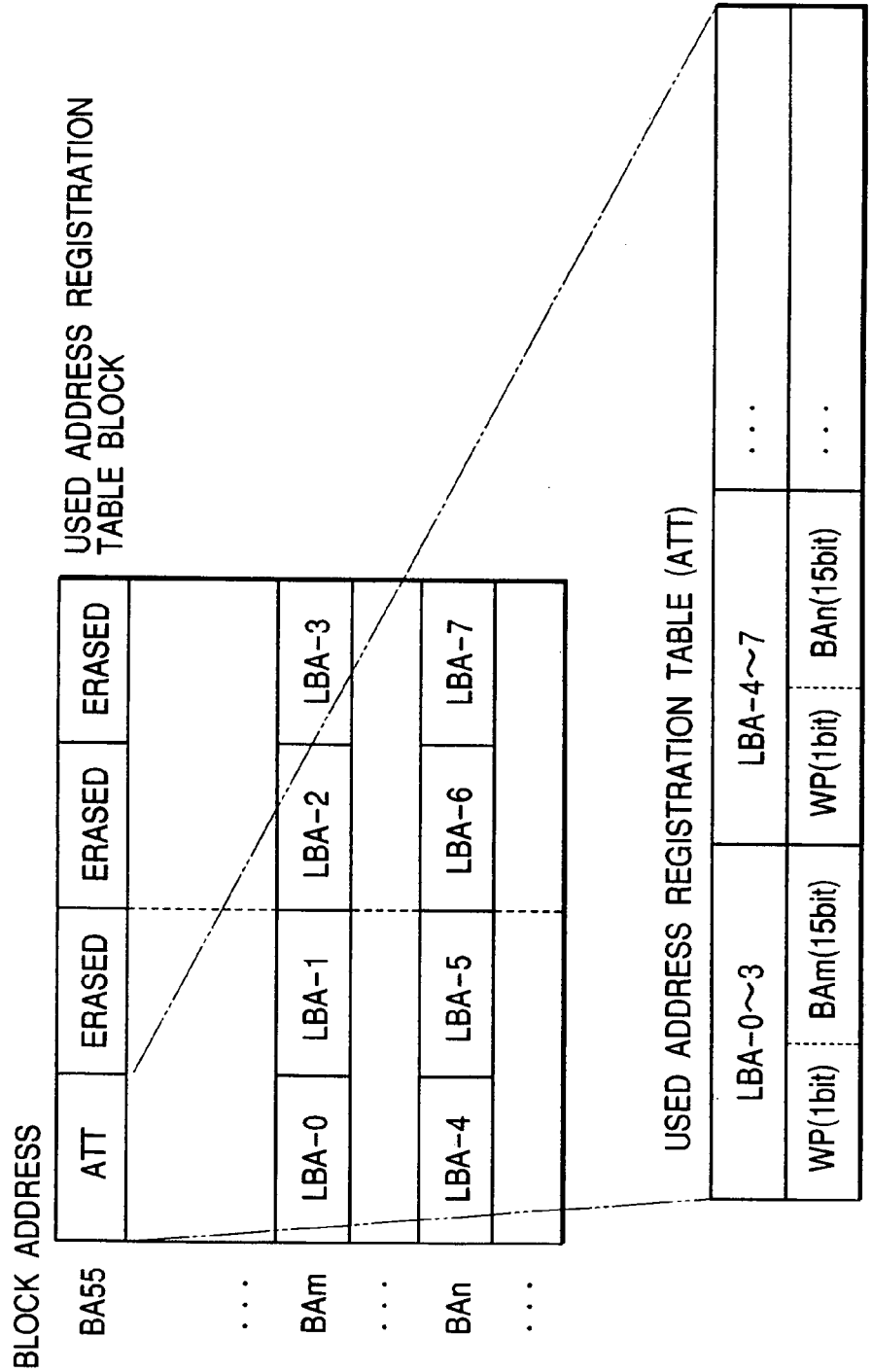
FIG. 3 illustrates an example of details of part of a used address registration table section, for instance used address registration table blocks arranged at a block address.

FIG. 3 illustrates an example of details of part of the used address registration table section 21, for instance used address registration table blocks arranged at a block address BA55. What is represented by ATT is one used address registration table resulting from the division, and is multiplexed fourfold with the areas marked "Erased" in the illustration. One at a time of the multiplexed four used address registration tables is validated in turn. The divided used address registration table ATT holds, for each of the logical addresses corresponding to the four storage sectors, information matched with the physical address of the corresponding memory sector, i.e. one block address. For instance, sequentially from the head of the used address registration table ATT onward, information in which the physical addresses of memory blocks are matched with logical addresses is stored in such a way that block addresses BAm are matched with logical addresses LBA0 through 3 and block addresses BAn are matched with logical addresses LBA4 through 7. Logical address information in the used address registration table is arranged in an ascending order for instance. It may as well be arranged in a descending order. In FIG. 3, memory block addresses such as block addresses BAm, BAn and so forth mean the addresses of memory blocks matching four consecutive logical address sectors, and have 15 bits for instance. Here, a one-bit write protect bit WP is added to each memory block address. The instruction from the host computer 6 on accessing the flash memory card 1 designates the address of the sector to be accessed (to be referred to as the logical sector address or the logical address), and the matching block address is searched for by using the used address registration table with this logical sector address as the search key.

<Unused Area Distinguishing Table>

Figure 4:
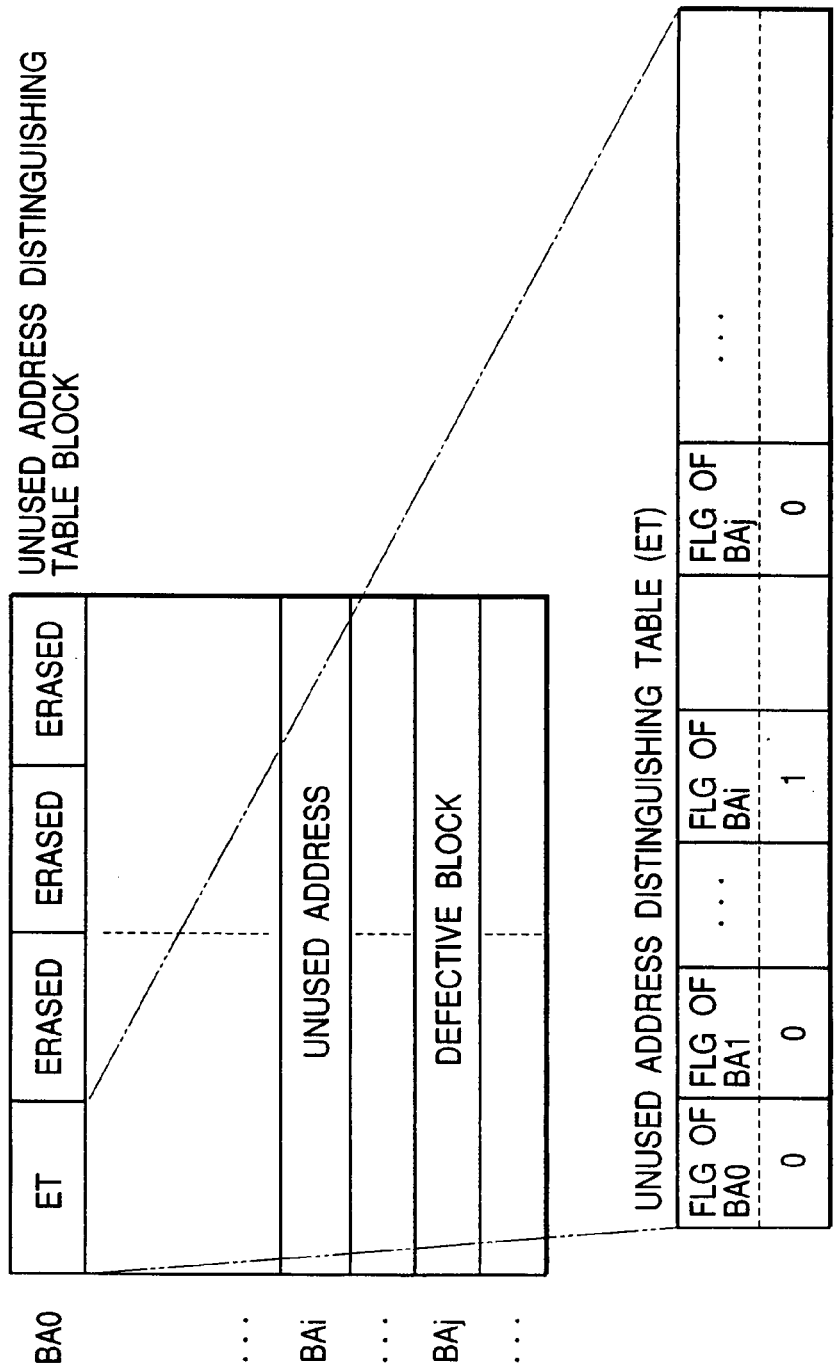
FIG. 4 illustrates details of part of an unused area distinguishing table section, for instance unused area distinguishing table blocks arranged at a block address.

FIG. 4 illustrates details of part of the unused area distinguishing table section 20, for instance unused area distinguishing table blocks arranged at a block address BA0. What is represented by ET is one unused area distinguishing table resulting from the division, and is multiplexed fourfold with the areas marked "Erased" in the illustration. One at a time of the multiplexed four unused area distinguishing tables ET is validated in turn. In the divided unused area distinguishing table ET, an unused state distinguishing flag FLG is matched with the physical address of each memory area, i.e. each block address. In short, bit by bit sequentially from the head of unused area distinguishing table ET onward, each area is filled with the bit of the flag FLG, first with the unused state distinguishing flag FLG of the leading block (block address BA0), then with the unused state distinguishing flag FLG of the next block (block address BA1) and so forth. Each unused state distinguishing flag FLG indicates in one bit whether or not the memory block corresponding to the erase unit is an unused area: "1" meaning an unused memory block and "0", a used memory block. The unused state distinguishing flags FLG in the unused area distinguishing table may be in either the ascending order or the descending order of block addresses (physical addresses).

The control method to sequentially validate one at a time of the tables each of which is quadruplex tables (the unused area distinguishing table ET and the used address registration table ATT) will be described. A multiplexed valid table is distinguished by an update flag allocated to the management area of each block. There are four bits per memory block of the update flag matched with the divided tables, given a value of "1" when the matching divided table is validated, and this state is maintained until erasure. Multiplex divided tables in the memory block are successively selected. Searching for a location which constitutes the boundary between the update flag values "1" and "0" at the leading point in the direction of selection validates the divided table matching the pertinent "1" update flag. Relocation of any valid divided table is done only when the contents of the table are to be updated. Updating a table in a state in which all the four bits of the update flag of one memory block are "1" is done by rewriting a block in the vacant block area 23, newly preparing the pertinent table, and reusing the original table as a vacant block. This processing serves to reduce the frequency of repeated use of the same nonvolatile memory cell on the table for rewriting.

<Write Action>

Figure 5:
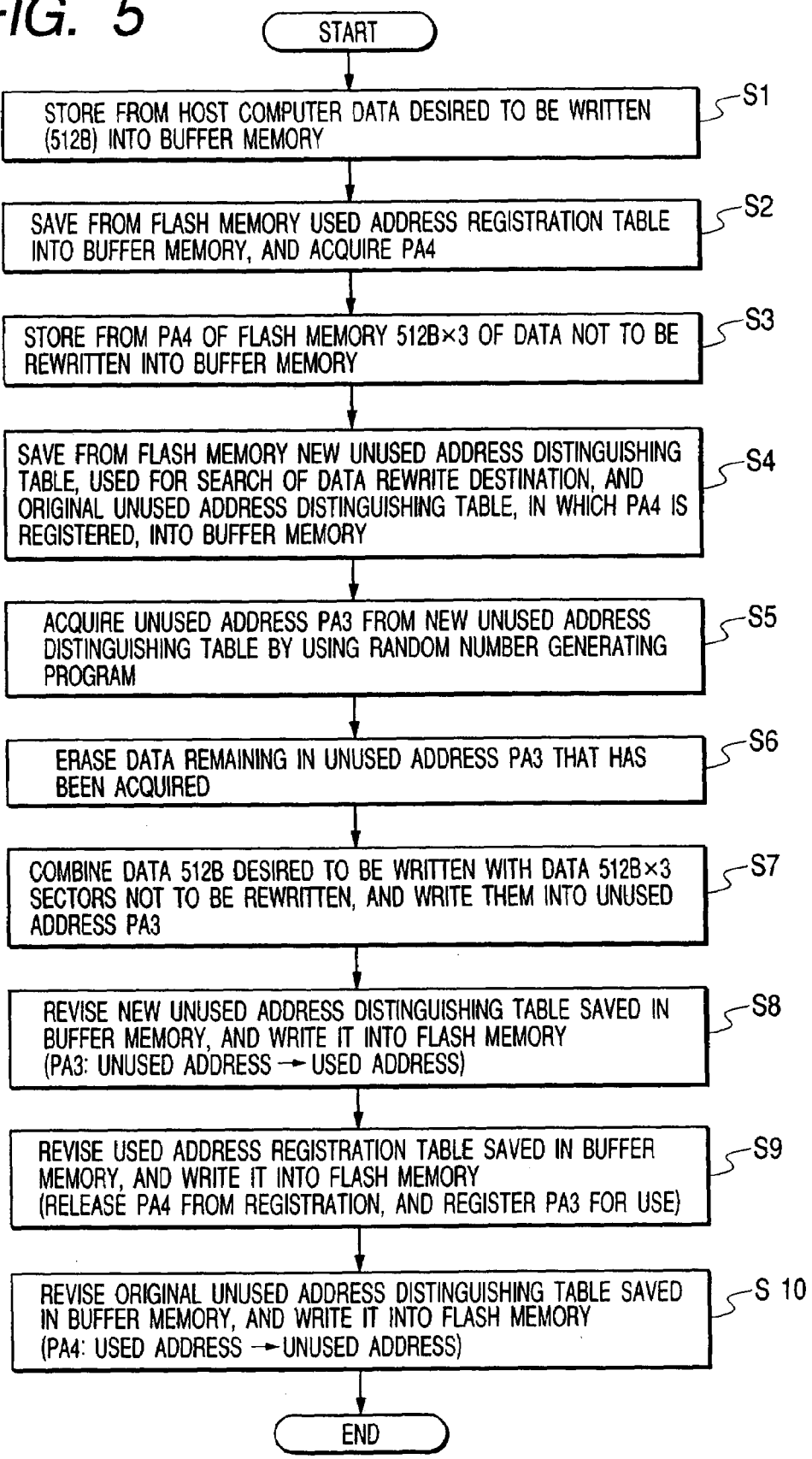
FIG. 5 is a flowchart of processing of an action to write into a memory card by utilizing an unused area distinguishing table and a used address registration table.
Figure 6:
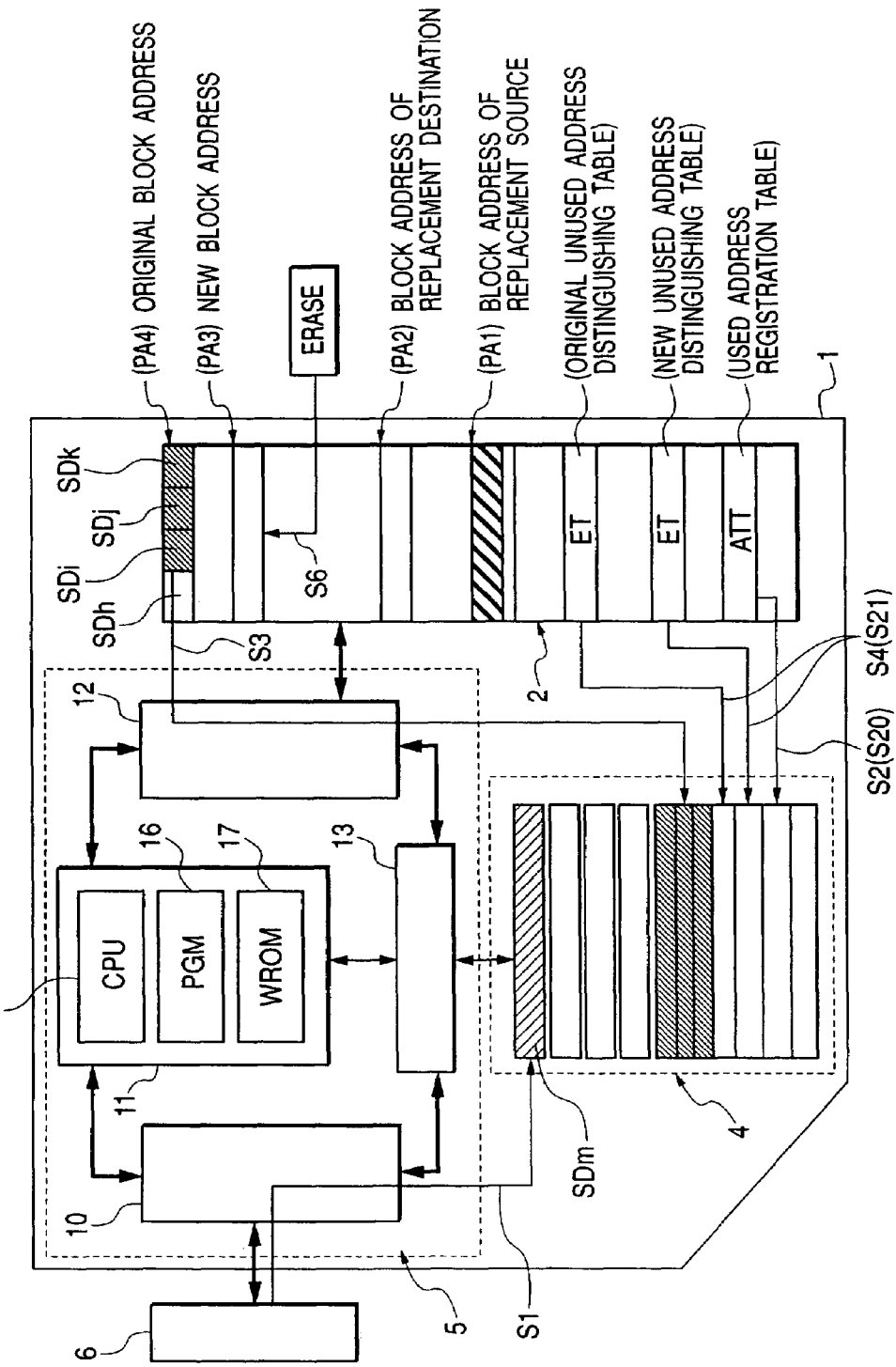
FIG. 6 illustrates main data flows and so forth in the processing charted in FIG. 5.
Figure 7:
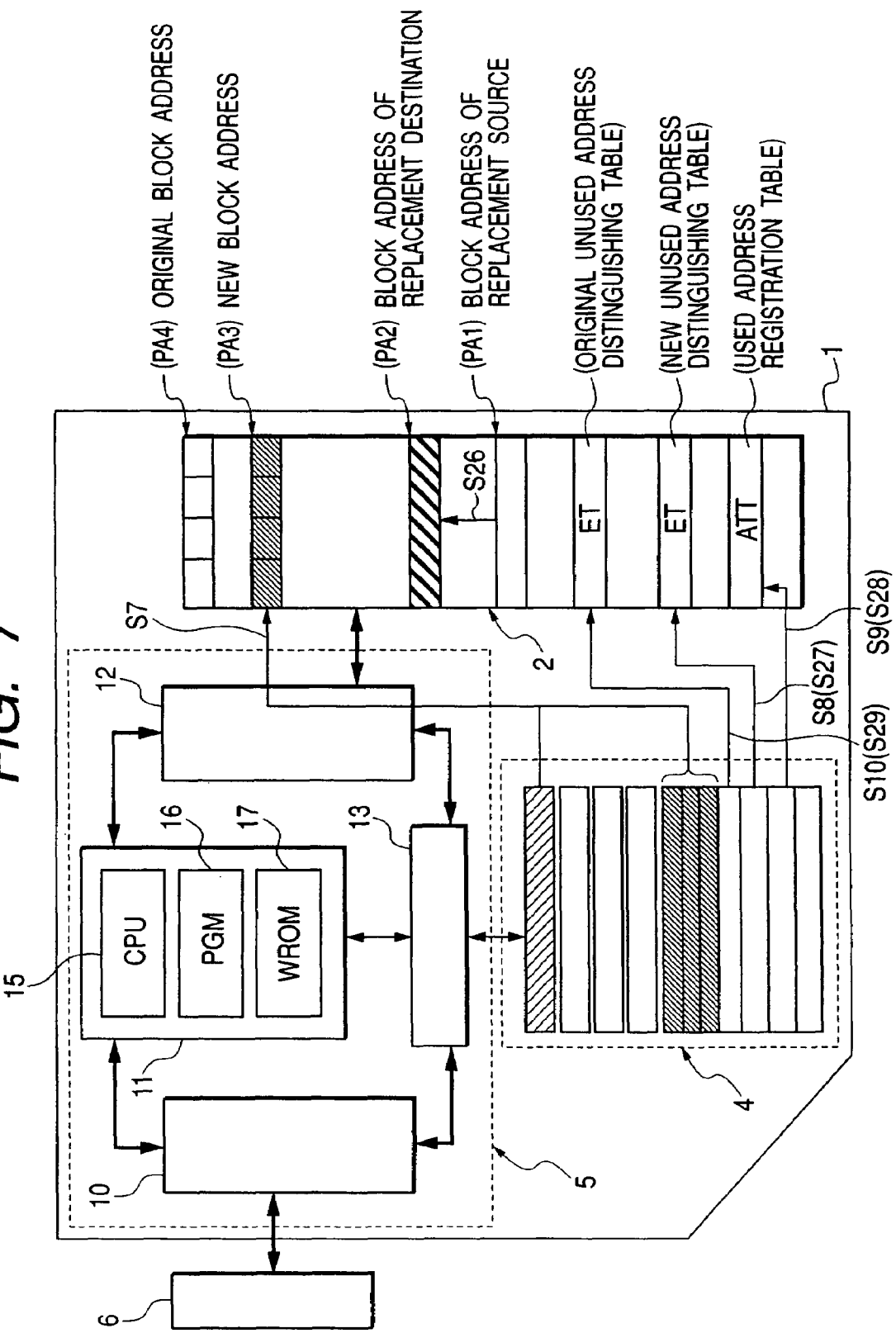
FIG. 7 illustrates main data flows and so forth in the processing charted in FIG. 5.

FIG. 5 shows the flow of processing of an action to write into a memory card by using the unused area distinguishing table 20 and the used address registration table 21. FIG. 6 and FIG. 7 illustrate main data flows and so forth in the processing charted in FIG. 5.

From the host computer 6 to the buffer memory 4, 512 bytes of write data for instance are supplied (S1). When a write access instruction is given regarding the write data, the card controller 5 stores from the flash memory 2 into the used address registration table buffer of the buffer memory 4 the used address registration table ATT in which is stored the block address matching the logical address LBA (logical sector address) to be written at (S2). Thus, since the logical address information for indexing the used address registration table section 21 is arranged in an ascending order, the memory block in which the required used address registration table is to be arranged is selected according to the logical address LBA. The management area of the selected memory block is first read, the valid used address registration table ATT is located out of the multiplexed state, and the used address registration table ATT is read on that basis. By searching the used address registration table that has been read, the block address PA4 currently matching the logical address for write (to be referred to as the original block address) is acquired.

The card controller 5 reads, out of the data stored at the original block address PA4, those not to be rewritten, stores them into the data buffer of the buffer memory 4, and combines them with write data from the host computer 6 (S3). If for instance the write data are data SDm of one storage sector, three storage sectors of data SDi, SDj and SDk are read out of the original block address OBA, and a total of four storage sectors of data are used as rewrite data.

Next, the card controller 5 reads an unused area distinguishing table ET matching the original block address PA4 (hereinafter to be referred to as the original unused area distinguishing table) into the original unused area distinguishing table buffer of the buffer memory 4 (S4). The unused area distinguishing table that is read is one of the valid tables among the four unused area distinguishing tables multiplexed in a single unused area distinguishing table block. Here, as described above, each of the divisively arranged unused area distinguishing tables is multiplexed with others, and one unused area distinguishing table out of the multiplexed ones is read with reference to the stage of the update flag in the management area. Further, the microprocessor 11 performs control to store into the buffer memory 4 the unused area distinguishing table to be used after the data rewrite (a new unused area distinguishing table) (S4). For instance, the microprocessor 11 executes a pseudo-random number generating program in the program ROM 16, and figures out a search start block address for acquiring the block address which is to be the write destination for the write data (a new block address). The card controller 5 stores into the buffer memory 4 the new unused area distinguishing table matching the search start block address obtained in this way. In this case too, as in the above-described case, one of the valid unused area distinguishing tables multiplexed in the unused area distinguishing table block is stored into the buffer memory 4.

The card controller 5 searches the new unused area distinguishing table, stored in the buffer memory 4, for an available new block address (unused address) PA3 (S5). Thus, it checks the unused state distinguishing flags FLG in an ascending or descending order from the search start block address acquired by executing the pseudo-random number generating program of the new unused area distinguishing table ET read into the buffer memory 4, and uses as the new block address PA3 the block address matching the first position where the flag FLG takes on a value of "1". The memory block matching the new block address PA3 is subjected to erase processing (S6).

Write processing with rewrite data, generated at the foregoing step S3, is performed on the memory block matching the unused address PA3 subjected to erase processing (S7). The write processing is determined as to whether it has been successful or not. If unsuccessful, the flag FLG matching the new block address pertaining to that write error is altered to a state of "0" on the new unused area distinguishing table read into the buffer memory 4 then, followed by a return to the foregoing step S5 to search the new unused area distinguishing table for another available block address and perform the processing again from midway.

If the write processing at step S7 is determined to be successful, first, the unused state distinguishing flag FLG matching the new block address PA3 is reset to a used state on the new unused area distinguishing table read into the buffer memory 4, and data in the reset new unused area distinguishing table is written into the memory block in the new unused area distinguishing table on the flash memory 2 as the rewrite data (S8). The new block address PA3 is thereby made a used address. Next, on the used address registration table ATT read into the buffer memory 4, the block address matching the currently accessed logical address is altered from the original block address PA4 to the new block address PA3, and data in the altered used address registration table is written into the memory block in the used address registration table on the flash memory 2 as the rewrite data (S9). The original block address PA4 is thereby withdrawn from entry in the used address registration table, and instead the new block address PA3 is registered as an entry. Finally, the unused state distinguishing flag FLG matching the original block address is reset to an unused state on the original unused area distinguishing table read into the buffer memory 4, and data in the altered original unused area distinguishing table is written into the memory block in the original unused area distinguishing table on the flash memory 2 as the rewrite data (S10). The original block address PA4 is thereby altered from a used address to an unused address.

Here in FIG. 6, block data of the original block address include sector data SDh, SDi, SDj and SDk, and at the new block address PA3, sector data SDh out of them is rewritten into sector data SDm by a write access from the host computer 6.

As is evident from FIG. 6 and FIG. 7, even though the rewrite data SDm, SDi, SDj and SDk are written into the memory block of the new block address PA3 at step S7, the pre-rewrite data SDh, SDi, SDj and SDk remain as they are in the memory block of the original block address PA4. The original unused area distinguishing table and the used address registration table on the flash memory 2 also remain as they are. Therefore, even if the flash memory card 1 is withdrawn from the card slot or operating power supply is otherwise cut off before the writing at step S7 is completed, the previous data will remain as it is. This is because the memory block into which the rewrite data is written is different from the memory block of the original data to be rewritten. Further, after the rewrite data has been rewritten at step S7, first, the new unused area distinguishing table in which the new block address PA3 has been reset into a used state is written back into the flash memory 2 (S8). Completion of the processing at step S8 ensures prevention of undesired erasure of the data written into the new block address PA3. This is because the memory block matching a flag FLG indicating a used state is treated as a non-erasable block. Next, the used address registration table in which the original block address PA4 has been altered to the new block address PA3 is written back into the flash memory 2 (S9). This makes the new block address accessible. The reset original unused area distinguishing table is written back last (S10), whose completion makes the memory block data at the original block address PA4 eligible for erasure and no longer necessary. Even if a power cutoff interrupts the processing at step S10, merely the memory block at the original block address will be made unavailable for reuse, with no trouble arising in accessing necessary data.

As is evident from the foregoing, the sequence of processing of the foregoing steps S8, S9 and S10 is of vital importance in thoroughly ensuring the prevention of undesired erasure of data by a power cutoff and facilitating the logical consistency of stored information management. Thus, after first processing the protection of the data of the new block address by forbidding their erasure (S8), processing is performed to make the data remaining in the original block address difficult to be taken out (S9), followed by processing to permit erasure of the data remaining in the original block address (S10). If, for instance, the processing sequence of S8 and S10 is reversed and the processing of S10 is completed earlier, both the new block address and the original block address will become eligible for erasure and, if power supply is interrupted in this state, both addresses will remain eligible for erasure at the risk of allowing necessary data to be undesirably erased.

<Replacement Processing>

The card controller 5 performs processing to replace memory blocks at a prescribed timing. The replacement processing means processing to write data stored in a memory block in which data is rewritten relatively infrequently into an unused memory block, and to make the memory block into which the write has been done a used area in place of the original memory block the data in which data is rewritten relatively infrequently.

Figure 8:
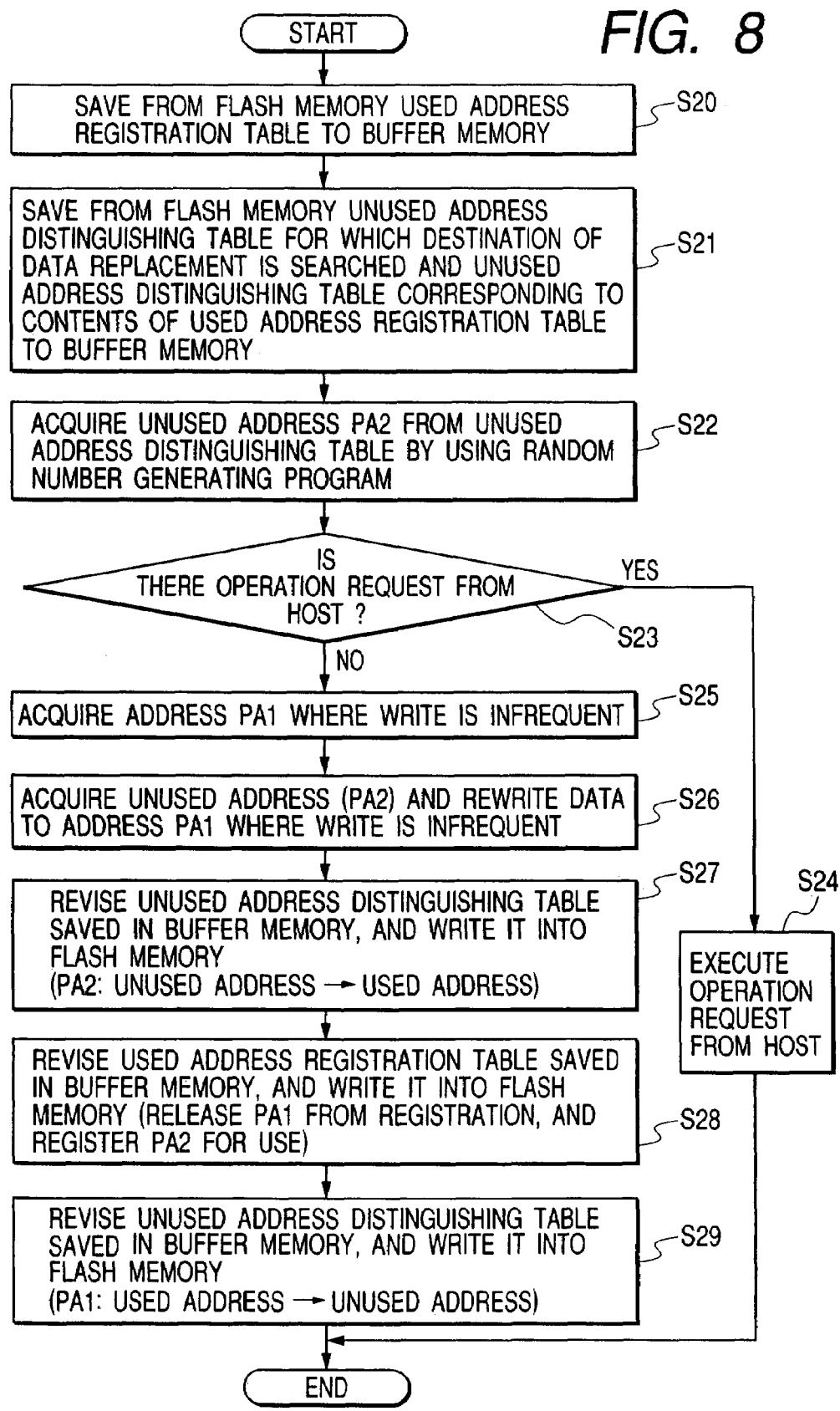
FIG. 8 is a flowchart of an example of replacement processing.

FIG. 8 is a flowchart of an example of replacement processing. Here, the block address of the replacement source is supposed to be PA1 and that of the replacement destination, PA2. In the description of FIG. 8, FIG. 6 and FIG. 7 will be referenced. The replacement processing charted in FIG. 8 is started in response to a specific command or to the end of a prescribed command, a write command for instance.

When the replacement processing is started, the microprocessor 11 first selects one of the used address registration tables ATT, for instance, and stores it from the flash memory 2 into the used address registration table buffer of the buffer memory 4 (S20). There is no limitation as to the choice of the table, which may be a random choice, the table ATT used immediately before, what is selected within the card controller 5 in accordance with a prescribed algorithm, or what matches a logical address designated by the host computer 6. Then, regarding block addresses contained as entries in the used address registration table read into the buffer memory 4, at least the unused area distinguishing table (the original unused area distinguishing table) and the unused area distinguishing table (the new unused area distinguishing table) to be used in searching for the shift destination memory block are stored into he buffer memory 4 (S21). Any unused area distinguishing table can be selected as the new one. Next, the microprocessor 11 executes, for instance, the pseudo-random number generating program in the program ROM 16 to search the new unused area distinguishing table for an unused block address which is to be the shift destination, and uses this as the replacement destination block address PA2 (S22).

At this stage, it is determined whether or not there is a request for any new action by an access command from the host computer 6 (S23). If there is, the action requested by the host computer 6 will be executed (S24). If not, the replacement processing will be continued. Thus, the used address registration table read in at step S20 is used to find an infrequently rewritten block address, which is used as the replacement source block address PA1 (S25). Searching for an infrequently rewritten block address can be made possible by, for instance, having the management area of each memory block hold rewrite frequency data, referencing the rewrite frequency data obtained from a group of memory blocks, and searching for a memory block whose rewrite frequency is sufficiently low.

Then, the microprocessor 11 reads out data held by the memory block of the replacement source block address PA1, saves the data into the buffer memory 4, erases data in the memory block of the replacement destination block address PA2, and writes herein the data saved in the buffer 4 (S26).

After that steps S27, S28 and S29 similar to the steps S8, S9 and S10 of write processing are performed. Thus on the new unused area distinguishing table read into the buffer memory 4, the unused state distinguishing flag FLG matching the replacement destination block address PA2 is reset into a used state, and data in the reset new unused area distinguishing table is written into the memory block of the new unused area distinguishing table on the flash memory 2 as the rewrite data, and the replacement destination block address PA2 is thereby made a used address (S27). Next, on the used address registration table ATT read into the buffer memory 4, the current matching between the replacement source block address PA1 and the logical address is altered to that between the replacement destination block address PA2 and its logical address, and data in the altered used address registration table is written into the memory block of the used address registration table on the flash memory 2 as the rewrite data (S28). The replacement source block address PA1 withdrawn from entry in the used address registration table, and instead the replacement destination block address PA2 is registered as an entry. Finally, on the original unused area distinguishing table read into the buffer memory 4, the unused state distinguishing flag FLG matching the replacement source block address PA1 is reset into an unused state, and data in the reset original unused area distinguishing table is written into the memory block of the original unused area distinguishing table on the flash memory 2 as the rewrite data (S29). The replacement source block address PA1 is thereby altered from a used address into an unused address. The sequence of processing of the foregoing steps S27, S28 and S29 has the same significance as that of the steps S8, S9 and S10 of the write processing.

Figure 9:
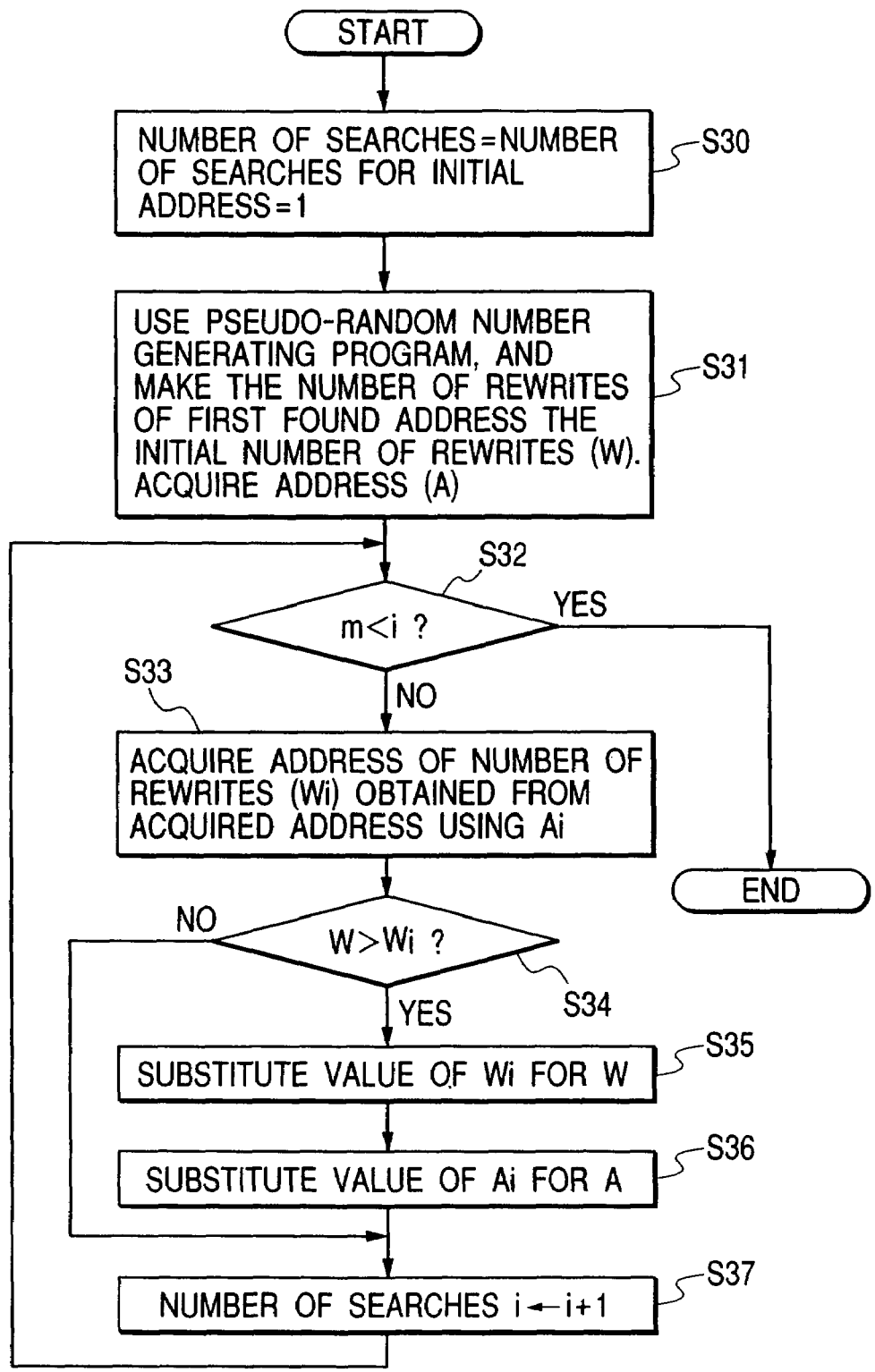
FIG. 9 is a flowchart of an example of procedure to search for a block address where writing does not take place frequently.

FIG. 9 shows an example of procedure to search for a block address where writing does not take place frequently. The initial value 1 is set in a search frequency counter i (S30), one block address is extracted by using the pseudo-random number generating program out of the used address registration table read in at step S20, its block address is set in an address register A, and the number of writes of its block address into the memory block is set on a number of writes counter W as the initial value of the number of writes (S31). Then, until the count of i surpasses m, the maximum number of searches, the following operation will be repeated (S32). Thus the number of rewrites data Wi is acquired from the memory block by using the count Ai of the address counter A preset by the initial address of A and incremented by +1 (S33), and it is determined whether or not W>Wi holds (S34). If W>Wi holds, Wi will be substituted into W (S35), Ai into A (S36), and i+1 into i (S37). If W>Wi does not hold, i+1 will be substituted into i (S37). When the processing ends where m<i holds, the minimum number of rewrites in the searched range remains as W, and A holds its block address.

FIG. 10 schematically illustrates how data is shifted by the write processing described with reference to FIG. 5 and the flow of data resulting from the replacement processing described with reference to FIG. 8. In the initial state, the block address PA1, for instance, is matched with the logical address LAi, the block address PA4 is matched with the logical address LAj, and the block addresses PA2 and PA3 are left unused. In writing at the logical address LAj, for instance, data Dn+Dm (512 bytes×3) at the block address PA4 is written into the memory block of the unused block address PA3, the block address PA3 is matched with the logical address LAj, and the memory block of the original block address PA4 is placed in an unused state. Thus, in usual write processing as well, the allocation of memory blocks is changed to even out the numbers of rewrites into memory blocks, but no used memory blocks in which rewriting never occurs are replaced by memory blocks as they are. The replacement processing is intended for such used memory blocks in which no rewriting occurs, i.e. used memory blocks into which rewriting is infrequent. In FIG. 10, PA1 denotes a block address where rewriting is infrequent. Data at this block address PA1 is shifted to another block address PA2, the logical address LAi allocated to PA1 is matched with the block address PA2, which is the shift destination, and PA1 is placed in an unused state. This enables data even in a memory block into which no writing by write access to an address designated by the host computer 6 occurs to undergo memory block replacement. Therefore, it is made-possible to prevent data garbling due to cumulative word line disturbances and bit line disturbances suffered by memory blocks in which no rewrite occurs. To even out the numbers of rewrites into memory blocks, memory blocks in which rewriting is infrequent are shifted to addresses having an average frequency of rewrites but not to memory blocks in which rewriting is frequent. If a shift is done to any memory block in which rewriting is frequent, predictably no more rewrite will take place, and memory cells in which rewriting is frequent may be deteriorated in performance characteristics, which means a risk of disturbance. The aforementioned average frequency of rewrites may be understood as a frequency higher than the frequency of rewrites in the memory block to serve as the replacement source of replacement processing. Regarding a method to select a memory block having the average frequency of rewrites, though not shown, one of the conceivable alternatives is to figure out the average frequency of rewrites in a range of a successive plurality of block addresses from any given address, and to select out of that range a memory block whose frequency of rewrites is the closest to the average and higher than the frequency of rewrites into the replacement source memory block.

Figure 11:
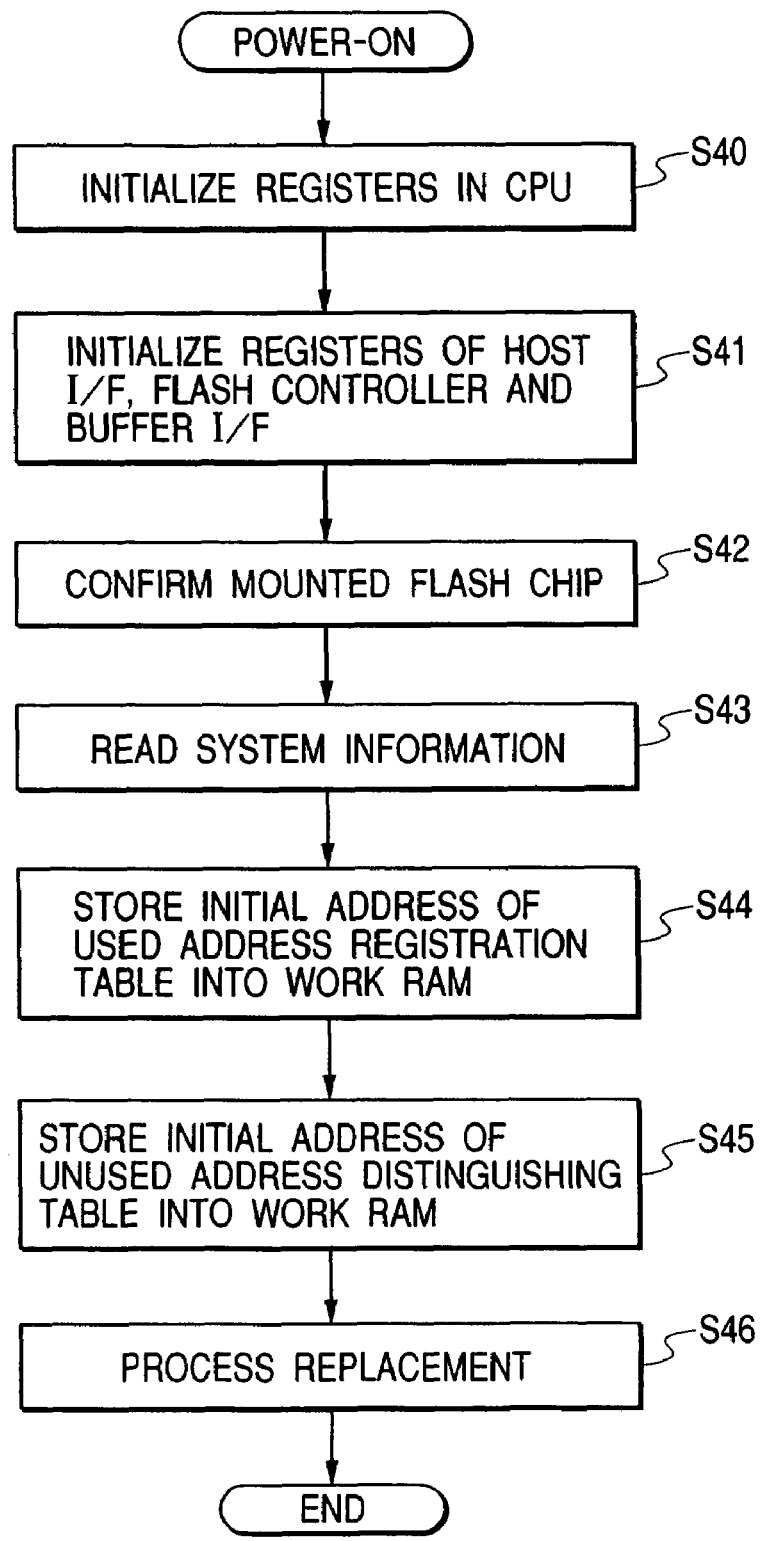
FIG. 11 is a flowchart of replacement processing performed as part of an operation to turn on power supply.

FIG. 11 is a flowchart of replacement processing performed as part of an operation to turn on power supply. When supply to the flash memory card 1 is turned on, a register in the CPU 15 is initialized (S40), and registers for the host interface circuit 10, the flash controller 12 and the buffer controller 13 are initialized (S41). Then, the flash memory 2 mounted on the flash memory card 1 is checked (S42), and system information is read out of the flash memory 2 (S43). Then, the initial address for storage in the used address registration table on the flash memory 2 is acquired, and stored into a work RAM 17 (S44). Similarly, the initial address for storage in the unused area distinguishing table on the flash memory 2 is acquired, and stored into the work RAM 17 (S45). At a subsequent timing, the card controller 5 performs replacement processing on memory blocks in which rewriting is infrequent (S46).

Figure 12:
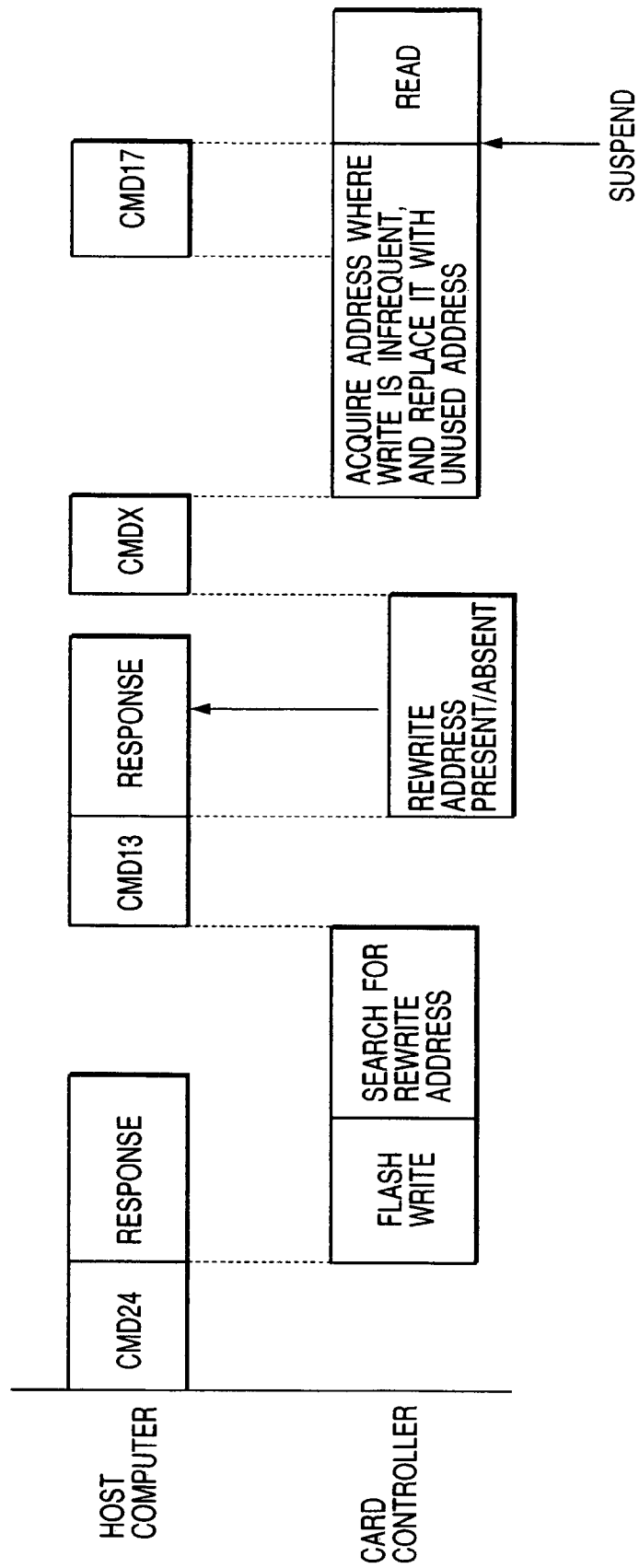
FIG. 12 is a timing chart of operation when replacement is processed in response to a dedicated command.

FIG. 12 is a timing chart of operation when replacement is processed in response to a dedicated command CMDX. When a write command CMD24 is issued from the host computer 6, the card controller 5 writes into the flash memory 2 in response to that command (Flash write). The host computer 6 waits for a response to the command (Response). The card controller 5, after the write, processes search for a shift address. The search for a shift address is processed by, for instance, acquiring a block address in which rewriting is infrequent and the frequency of rewriting by the processing shown in FIG. 9 and, if the frequency of rewriting is below a prescribed level, determines that there is a shift address. The host computer 6, when the time taken for the shift address search has elapsed, issues a status read command CMD13 to the card controller 5. The card controller 5 supplies the result of determination of whether there is a shift address or not, and the host computer 6 receives it as the response. For instance, if the result of checkup indicates the presence of many addresses to be shifted, the host computer 6 issues a replacement processing command CMDX to the card controller 5. If, for example, the result of checkup indicates the presence of many memory blocks to be shifted, the card controller 5 requests the host computer 6 to issue a replacement processing command CMDX. This replacement processing command CMDX is a dedicated command, different from a mere write command, which is given along with the designation of a write address. The replacement processing command CMDX is not accompanied by the designation of the address to be written at.

The card controller 5, in response to a write processing command, acquires the block address of a replacement source where rewriting is even more infrequent than the block address of the replacement destination earlier found by shift address search processing, and processes rewriting. This processing is done in the same procedure as that described with reference to FIG. 8 and others. If an access command and the like (e.g. a read command CMD17) is issued by the host computer 6 during the replacement processing, the card controller 5 suspends the replacement processing, and shifts to processing to respond to the access command. This priority is intended not to oblige an access request by the host computer 6 for read or write to await processing.

Figure 13:
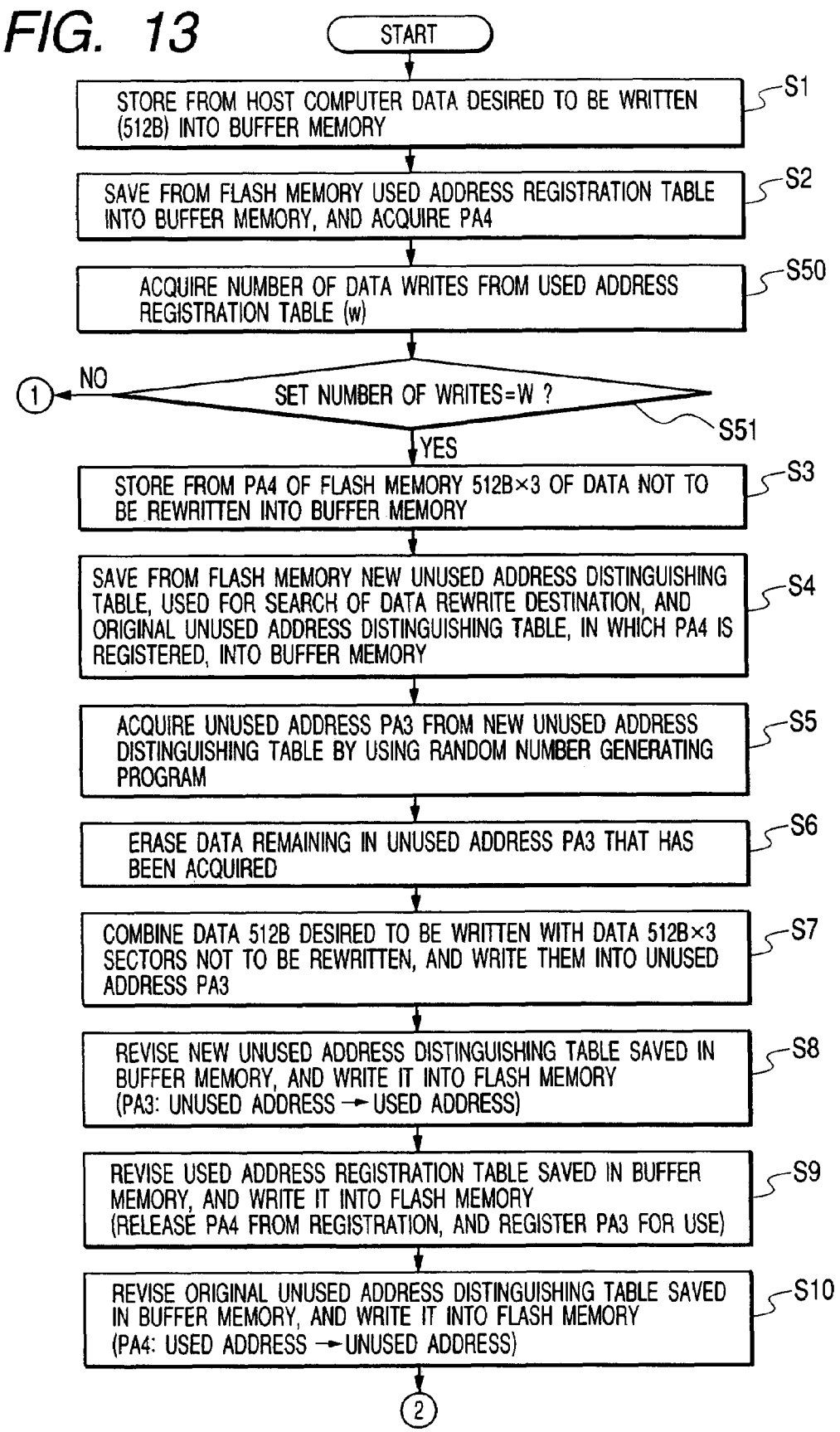
FIG. 13 is a flowchart of replacement processing according to the overall number of writes into the flash memory.
Figure 14:
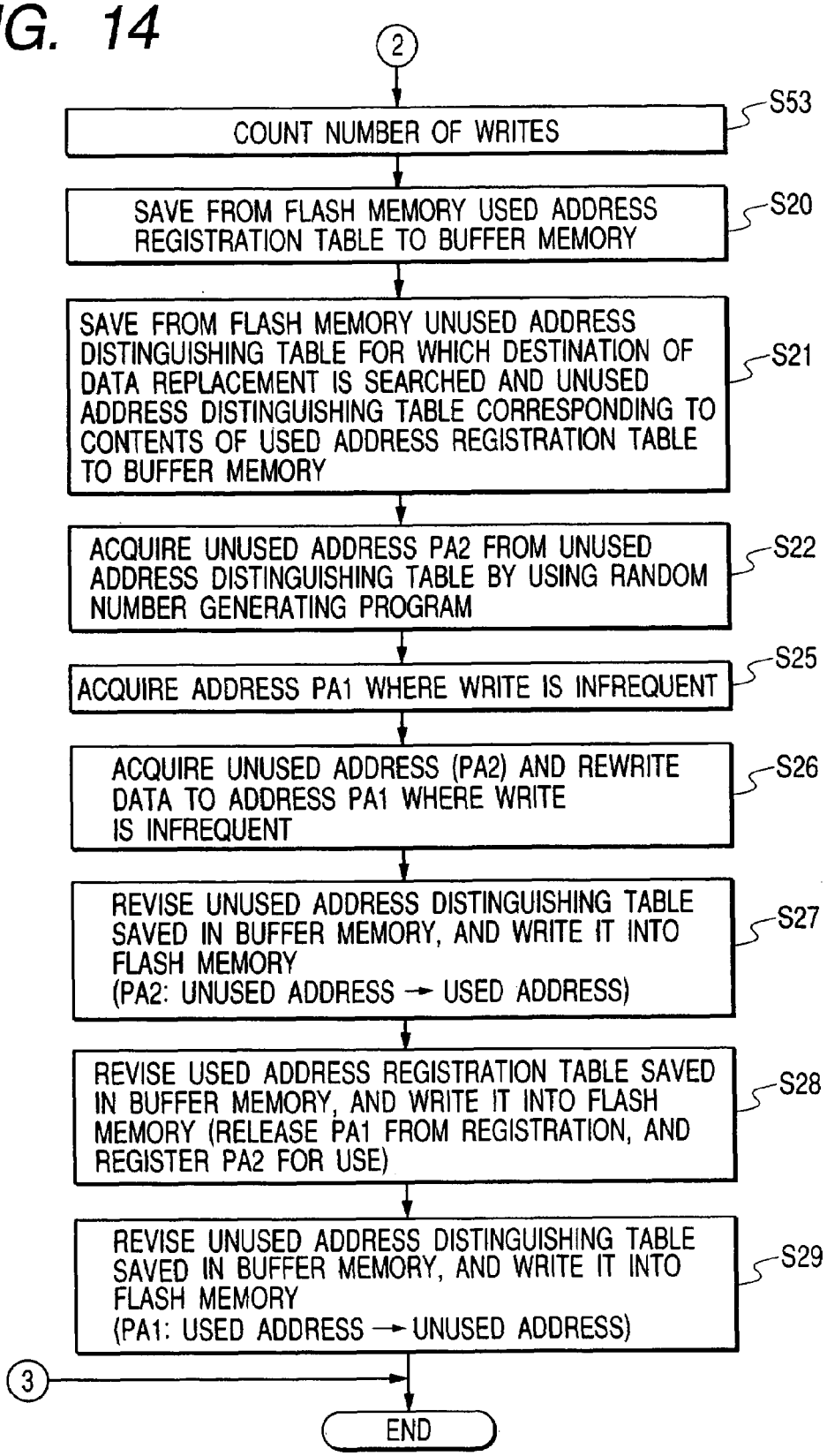
FIG. 14 is a flowchart of another part of replacement processing according to the overall number of writes into the flash memory.
Figure 15:
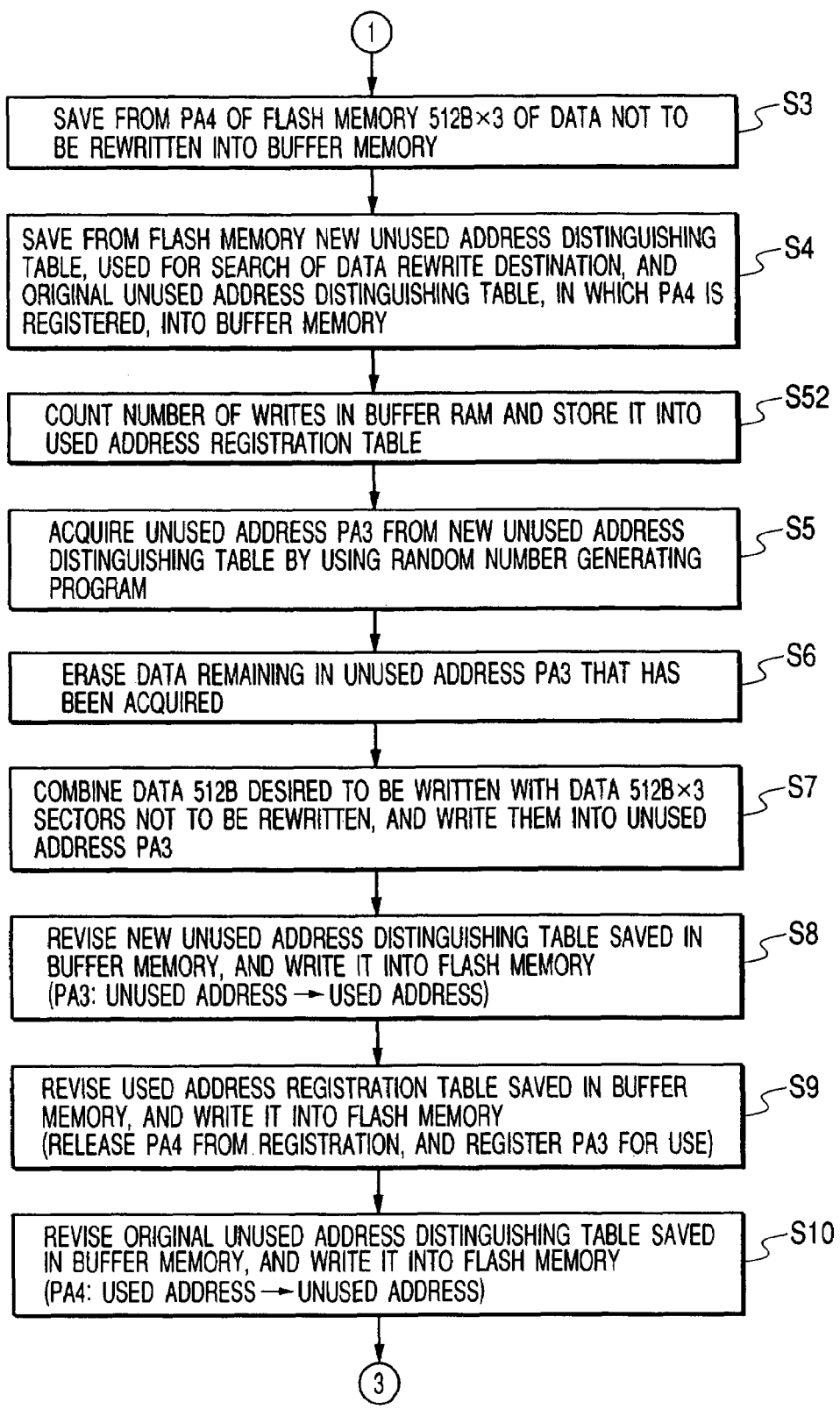
FIG. 15 is a flowchart of still another part of replacement processing according to the overall number of writes into the flash memory.

FIG. 13 through FIG. 15 show an example of replacement processing according to the overall number of rewrites into the flash memory. In the example to be described here, replacement processing is performed as part of response to a write access by the host computer. A prescribed storage area in a used address registration table of the flash memory is allocated as the nonvolatile storage area for holding the overall number of writes into the flash memory. The data on the overall number of rewrites is read out of the flash memory into the buffer memory 4 and used as required. The data on the overall number of rewrites read into the buffer memory 4 is incremented at every write action, for instance, reset at every fixed count (e.g. 5000), and the counting is done by a ring counter formula, by which counting from an initial value is repeated. The altered data on the overall number of rewrites is saved from the work RAM 17 into the flash memory 2.

Step numbers of processing shown in FIG. 13 through FIG. 15 are the same as those of the corresponding steps in FIG. 5 or FIG. 8, where there are counterparts, and detailed description of these common steps is dispensed with. The differences in the sequence of FIG. 13 from that in FIG. 5 will be described below. After the processing at step S2, the card controller acquires the data on the overall number of rewrites from a used address registration table on the flash memory 2 (S50), and determines whether or not the overall number of rewrites has reached a setpoint, for example 5000 (S51). If it is reached, the following steps S3 through S10 of write processing are performed and, after the overall number of rewrites is incremented by +1 (S53), replacement processing is carried out by the steps S20 through S22 and S25 through S29. If it is not, replacement processing is carried out by the step S3 through S10, the overall number of rewrites is incremented by +1 on the way of that processing, and the incremented count is stored into the matching used address registration table on the flash memory (S52).

<Read Action>

Figure 16:
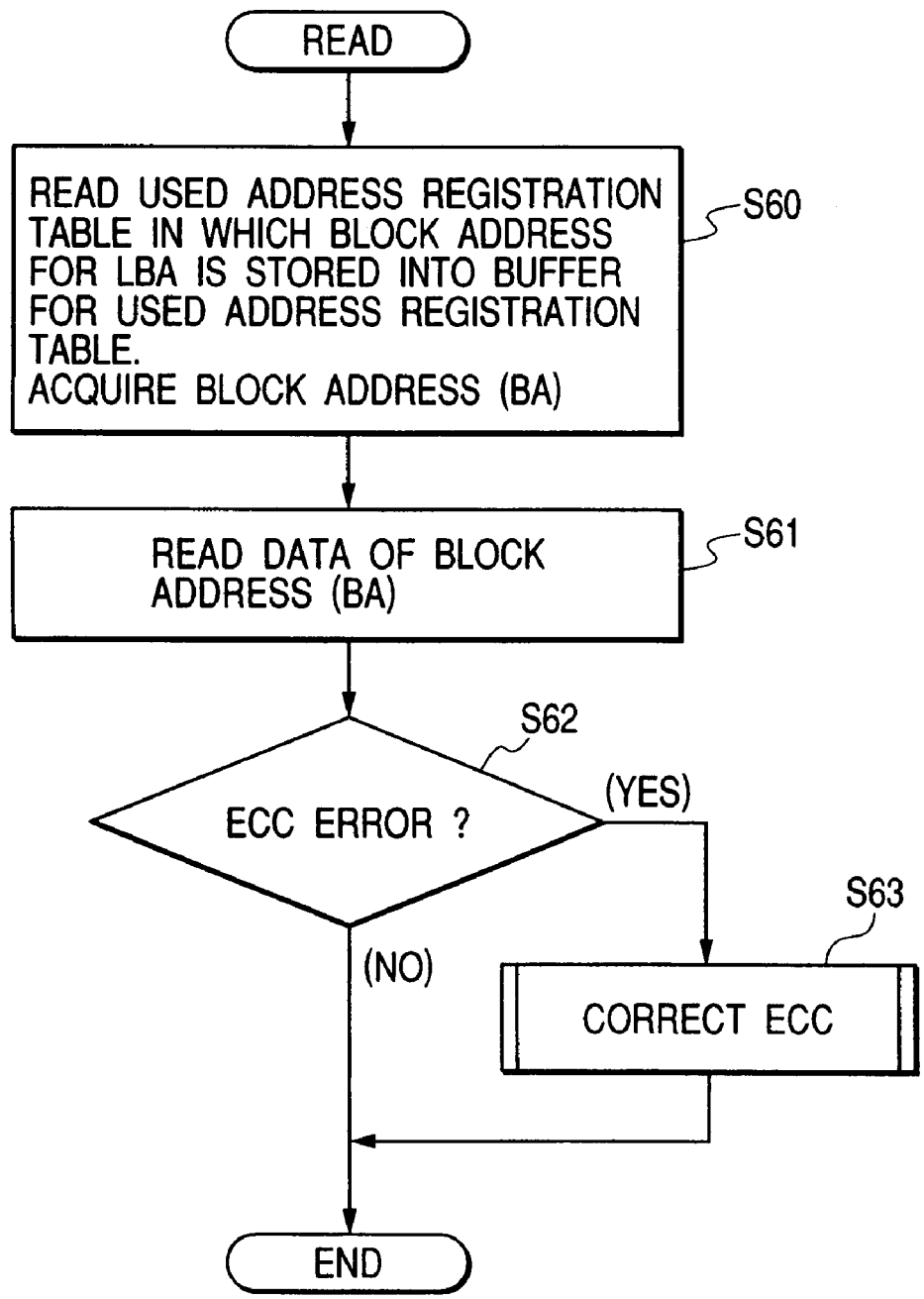
FIG. 16 is a flowchart of reading out of the memory card utilizing the used address registration table section.

FIG. 16 shows the flow of reading out of the memory card utilizing the used address registration table section 21. When a read command is issued from the host computer 6, the card controller 5 reads into the used address registration table buffer of the buffer memory 4 the used address registration table ATT in which the block address matching the logical address LBA (the logical sector address) is stored (S60). Then, since the logical address information for indexing the used address registration table section 21 is arranged in the ascending order, first the memory block in which the used address registration table is to be arranged can be selected according to that information. Out of the selected block, first the management area is read, a valid one is located out of the multiplexed used address registration tables ATT, and the used address registration table ATT is read on that basis. Then, by searching the used address registration table that has been read, the memory block address (BA) currently matching the logical address to be read is acquired (S60).

The card controller 5 reads data stored at the memory block address BA (S61). The data so read is checked as to the presence or absence of any ECC error (S62). If there is any error, ECC correction is processed (S63), and the read data is supplied to the host computer 6.

While the foregoing description specifically concerned the invention achieved by the present inventors with reference to a preferred mode of implementing it, the invention obviously is not limited to what has been described above, and can be modified in may different ways without deviating from its essentials.

For instance, the number of channels used in multiplexing the unused area distinguishing tables and the used address registration tables is not limited to four, but can be double that, i.e. eight, in which case different memory blocks are used. In this case, the sequence of tables to be validated out of the plurality of multiplexed tables can be so selected by that the memory block be different each time. In rewriting the tables, the new memory block will then be different from the original memory block and, even if power supply is interrupted during the rewriting of any table, the contents of the original table can be maintained without being lost.

Also, the method by which memory blocks in which rewriting is relatively infrequent are searched for is not limited to what was described with reference to FIG. 9. For instance, the data representing the number of rewrites may express the number in thousands. Or it may be one-bit data or a flag indicating whether or not a prescribed number has been reached. Rewriting is done by writing and erasing. The number of rewrites can also be expressed in that of erasures or that of writes.

Erase or write processing need not be done word line by word line. The configuration of the flash memory is not limited to that in which one memory cell stores binary data, and may as well be what permits storage of multi-valued information involving four or more values. Obviously, the nonvolatile memory is not restricted to a flash memory, but may be a memory of some other storage type, such as a ferroelectric memory. The control circuit, such as the card controller, need not be provided with a host interface circuit, such as IDE, and can be applied to a memory card so standardized as to have its function borne by the host computer.

Advantages achieved by the present invention disclosed in this application in its typical aspects will be briefly described below.

Thus in the memory device pertaining to the invention, since replacement processing is intended to replace memory areas in which rewriting is infrequent with other memory areas, it is possible to prevent the risk of data garbling due to the cumulative impact of disturbances occurring in memory areas in which no rewrite occurs. Also, in the memory device pertaining to the invention, when data is to be rewritten, since write block address management is so carried out in processing replacement in the unused area distinguishing table as to use a block address different from the original block address as the write destination or replacement destination, data restoration is possible even if an undesired power cutoff occurs during erasure or replacement.

What is claimed is:

1. A nonvolatile memory device comprising:
an erasable and writable nonvolatile memory; and
a control circuit,
wherein said control circuit performs replacement processing of memory areas according to a prescribed timing,
wherein said replacement processing is accomplished by writing data stored in a first memory area in which rewriting is relatively infrequent into an unused second memory area, and making the second memory area into which the writing has been done a used area in place of said first memory area,
wherein each said memory area holds rewrite frequency data,
wherein said control circuit references the rewrite frequency data to search for an alternative memory area having a rewrite frequency higher than a rewrite frequency of said first memory area and being closest to an average rewrite frequency based on rewrite frequencies of a plurality of memory areas, and to use the alternative memory area as said second memory area.

2. The nonvolatile memory device according to claim 1, wherein said control circuit references rewrite frequency data obtained from each of a group of memory areas and searches them for said first memory area.

3. The nonvolatile memory device according to claim 1, wherein each memory area of said nonvolatile memory is provided with a storage area for storing a distinguishing flag indicating whether or not the area is unused, and wherein said control circuit references said distinguishing flag to search for said unused second memory area.

4. The nonvolatile memory device according to claim 1, wherein said control circuit performs said replacement processing in response to a specific command.

5. The nonvolatile memory device according to claim 1, wherein said control circuit performs said replacement processing in response to completion of processing of a specific command.

6. The nonvolatile memory device according to claim 1, wherein, in the event of an instruction by another command after a start of said replacement processing, the ongoing replacement processing is abandoned to give priority to processing of that other command.

7. The nonvolatile memory device according to claim 1, wherein said control circuit performs said replacement processing in response to rewriting the nonvolatile memory a predetermined number of times.

* * * * *